(12) United States Patent
Kawata

(10) Patent No.: US 6,806,500 B2
(45) Date of Patent: Oct. 19, 2004

(54) ELECTRO-OPTICAL DEVICE AND ELECTRONIC APPARATUS

(75) Inventor: Hidenori Kawata, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/427,915

(22) Filed: May 2, 2003

(65) Prior Publication Data

US 2003/0234899 A1 Dec. 25, 2003

(30) Foreign Application Priority Data

May 2, 2002 (JP) ........................................ 2002-130834

(51) Int. Cl.[7] ........................ H01L 29/04; G02F 1/1337
(52) U.S. Cl. .......................... 257/72; 257/59; 257/66; 257/74; 349/124; 349/134; 349/138; 349/143
(58) Field of Search ................................ 257/59, 66, 74, 257/79, 72; 349/123, 124, 134, 138, 143

(56) References Cited

U.S. PATENT DOCUMENTS 5,721,601 A * 2/1998 Yamaji et al. ............... 349/138

* cited by examiner

*Primary Examiner*—Donghee Kang
(74) *Attorney, Agent, or Firm*—Oliff & Berridge, PLC

(57) ABSTRACT

An electro-optical device includes a TFT array substrate, pixel electrodes, thin film transistors electrically connected to the pixel electrodes, scanning lines and data lines connected thereto, and a nitride film disposed at least on surfaces of the data lines provided above the TFT array substrate.

13 Claims, 11 Drawing Sheets

ELECTRO-OPTICAL DEVICE AND ELECTRONIC APPARATUS

BACKGROUND OF THE INVENTION

1. Field of Invention

The present invention relates to technical fields of electro-optical devices and electronic apparatuses. More particularly, the invention relates to an electro-optical device including a pair of substrates which sandwich an electro-optical material, such as a liquid crystal, and various lines provided on the substrates, and to an electronic apparatus including such an electro-optical device.

2. Description of Related Art

The related art includes an "active matrix electro-optical device," which includes an electro-optical material, such as a liquid crystal, pixel electrodes arrayed in a matrix, thin film transistors (hereinafter "TFTs") connected to the respective pixel electrodes, and scanning lines and data lines which are connected to the respective TFTs, the scanning lines extending in parallel in the row direction, the data lines extending in parallel in the column direction, thus enabling active matrix driving.

In addition to a TFT array substrate having the construction described above, such an electro-optical device includes a counter substrate provided with a common electrode which is opposed to the TFT array substrate with the electro-optical material, such as a liquid crystal, therebetween. Other structures that are provided on the TFT array substrate in addition to the TFTs, scanning lines, data lines, etc., include storage capacitors connected to the TFTs in order to store electric fields applied to the pixel electrodes for a predetermined period of time, interlayer insulating films to prevent short circuiting between the individual components, and contact holes formed in the interlayer insulating films in order to provide necessary electrical connection between the individual elements.

SUMMARY OF THE INVENTION

However, the related art electro-optical device is subject to a drawback. That is, the TFT has a relatively short lifetime. The reason for this is that, if moisture enters the semiconductor layer and the gate insulating film constituting the TFT, positive charges are generated due to the diffusion of water molecules into the interface between the gate insulating film and the semiconductor layer, resulting in an increase in the threshold voltage Vth in a relatively short period of time. Such a phenomenon is more common in a p-channel TFT.

If the TFT has a relatively short lifetime as described above, the entire electro-optical device is inevitably affected, and a degradation in image quality is observed from a relatively early stage, which may result in device failure.

Such an inconvenience becomes more serious when an electro-optical device is used in a high-temperature, high-humidity environment. The reason for this is that the chance of moisture entry into TFTs increases. When an electro-optical device is used as a light valve for a liquid crystal projector, since relatively strong light emitted from a light source built in the liquid crystal projector is applied to the electro-optical device or the light valve, it is subjected to high temperature. This is a severer environment from the viewpoint of TFT life, and the problem described above easily becomes noticeable.

Additionally, although the TFT array substrate is provided with various components, such as TFTs, scanning lines, and data lines, and interlayer insulating films to isolate these components from each other, even the interlayer insulating films are not capable of sufficiently preventing moisture from entering the TFTs.

The present invention addresses the above and/or other problems, and provides an electro-optical device in which entry of moisture into TFTs is reduced or minimized to prolong the operational life. The invention also provides an electronic apparatus including such an electro-optical device.

In one aspect of the present invention, in order to address or overcome the above, an electro-optical device includes thin film transistors corresponding to intersections of scanning lines and data lines above a first substrate, pixel electrodes corresponding to the thin film transistors, and a nitride film disposed at least on the surfaces of the data lines.

In the electro-optical device of the present invention, the operation of the thin film transistors is controlled through the scanning lines, and image signals are applied to the pixel electrodes through the thin film transistors, thereby enabling so-called "active matrix driving".

In particular, in the present invention, since the nitride film is disposed at least on the surfaces of the data lines, the following effect can be obtained. That is, it is possible to reduce or prevent moisture from entering the thin film transistors, or gate insulating films and semiconductor layers constituting the thin film transistors. The reason for this is that the nitride film has a dense structure.

Consequently, in the electro-optical device of the present invention, a stable operation can be achieved for a relatively long period of time.

In the present invention, the nitride film must be formed at least on the surfaces of the data lines, which means that the nitride film may be formed on the scanning lines, or in some cases, may be formed over the entire surface of the substrate. The "nitride film" in the present invention is represented by a silicon nitride film (SiN film, SiON film, or the like). Of course, a nitride film other than this is acceptable.

In one exemplary embodiment of the present invention, in the electro-optical device, the pixel electrodes are arrayed in a matrix, the scanning lines and the data lines intersect with each other corresponding to the matrix of the pixel electrodes, and the nitride film is disposed at least over the surfaces of the data lines and the scanning lines.

In this exemplary embodiment, since the scanning lines and the data lines are formed in a grid pattern or the like as a whole, the nitride film disposed thereon may also be formed in a grid pattern. Consequently, the effect of preventing moisture entry can be obtained more reliably.

The fact that the nitride film can be formed in such a pattern means that it is possible to have a construction in which the nitride film is not substantially placed over the entire surfaces of the pixel electrodes. In such a case, the overall transmittance of the electro-optical device can be maintained. Consequently, in this exemplary embodiment, due to the presence of the nitride film, in addition to the effect of prolonging life, it is possible to provide a brighter image with high quality. According to the research by the present inventors, it has been confirmed that the transmittance decreases by approximately 4% when the nitride film is left over the entire surface compared with the case in which no nitride film is provided.

Additionally, "being arrayed in a matrix" is a broad concept which includes a structure in which the individual pixel rows and the individual pixel columns extend straight vertically and horizontally, respectively, and also includes a structure in which the individual pixel rows and the individual pixel columns are two-dimensionally arrayed in a meandering manner or in a staggered manner. Therefore, it is to be understood that "the shape corresponding to the matrix" must be construed bearing the above in mind.

In another exemplary embodiment of the present invention, in the electro-optical device, the nitride film is formed in the periphery of an image display region that is defined by the region including the pixel electrodes, the scanning lines, and the data lines.

In this exemplary embodiment, the nitride film is also formed in the periphery of the image display region in addition to at least on the surfaces of the data lines or at least on the surfaces of the data lines and the scanning lines. Consequently, the effect of reducing or preventing moisture entry can be obtained more reliably.

In this exemplary embodiment, more preferably, the nitride film extends only on the data lines in addition to in the periphery of the image display region.

In such a case, as described above, since it is possible to have a structure in which the nitride film is not substantially placed over the entire surfaces of the pixel electrodes, the overall transmittance of the electro-optical device can be maintained.

In the structure in which the nitride film is formed only on the data lines, it is possible to decrease stress which affects internally as is obvious when compared to the structure, for example, that the nitride film is formed over the entire surface of the substrate. Consequently, it is possible to prevent the nitride film itself from being broken due to its internal stress or to reduce such breakage. It is also possible to prevent cracks from occurring in the other components (e.g., interlayer insulating films) around the nitride film under the influence of the internal stress or to reduce such cracks. The same effects are also applied in general to the nitride film with a grid pattern or the like.

Moreover, the present inventors have confirmed that even in the structure in which the nitride film is formed in the periphery of the image display region and only on the data lines, it is possible to prolong the operational life of the thin film transistors or the electro-optical device by approximately three times. Consequently, in this exemplary embodiment, by a reduced or the minimum use of the nitride film, moisture can be effectively reduced or prevented from entering the TFTs.

Additionally, the presence of the nitride film "only on the data lines" refers to a case in which the nitride film is placed only right above the data lines, and also refers to a case in which the nitride film is placed in the periphery of and right above the data lines. That is, any case in which the nitride film is placed substantially in the periphery of the data lines only is included in the range of this structure.

In another exemplary embodiment of the present invention, in the electro-optical device, the nitride film is formed in a region excluding light transmission regions above the substrate.

In this exemplary embodiment, first, "the light transmission regions" refer to regions in which light that contributes to image display passes through the electro-optical device. More specifically, the regions in which the pixel electrodes arrayed in a matrix are formed substantially correspond to the light transmission regions. In other words, the light transmission regions refer to regions excluding the regions in which the scanning lines and the data lines are formed and the light shielding regions in which light-shielding films are formed in a grid pattern on the surface of the substrate.

Consequently, in this exemplary embodiment, since the nitride film is formed in the regions in which light that contributes to image display is not prevented from traveling, there is no or substantially no possibility of a decrease in the overall transmittance of the electro-optical device.

In another exemplary embodiment of the present invention, in the electro-optical device, the width of the nitride film on the data line is larger than the width of the data line.

In this exemplary embodiment, it is possible to reduce damage to the data lines which may occur in the fabrication process of the electro-optical device.

That is, for example, in the case in which the nitride film is formed only on the data lines, specifically, a fabrication process using so-called photolithography is typically assumed, in which after an original nitride film is formed over the entire surface of the substrate, a resist layer having a predetermined pattern (in this case, "a pattern covering the data lines only") is formed, and the resist layer and the original film are etched. However, since the etching step and the resist-stripping step are involved in this process, the data lines may be damaged unnecessarily in such steps.

In this exemplary embodiment, however, since the width of the nitride film is larger than the width of the data line, the edges of the nitride film are subjected to damage due to etching, etc., and damage to the data lines can be reduced or minimized.

Consequently, the stable operation of the electro-optical device is ensured, and high-quality images can be displayed.

More preferably, the width of the nitride film is larger than the width of the data line by 0.1 to 2.2 $\mu$m for each edge.

In such a construction, the width of the nitride film is properly set with respect to the width of the data line, and the effect of reducing or preventing damage to the data line is achieved more reliably.

In another exemplary embodiment of the present invention, in the electro-optical device, the thickness of the nitride film is 3 to 100 nm.

In this exemplary embodiment, the thickness of the nitride film is properly set, and the influence of the internal stress of the nitride film can be reduced or eliminated more effectively.

If the thickness of the nitride film is set at a relatively small value as described above, the following effect is also obtained. That is, when some components, such as elements, lines, and the like, are formed on the substrate and interlayer insulating films, etc., are formed in the regions in which the components are formed and in the other regions, so-called "steps" may occur on the surfaces of the interlayer insulating films, etc. This is because each component has its specific "height". If such steps occur, the coating of the alignment layers which are usually provided in an electro-optical device, such as a liquid crystal display, becomes nonuniform, or rubbing treatment cannot be performed properly on the alignment layers, resulting in a degradation in image quality, such as a decrease in contrast.

In this exemplary embodiment of the invention, since the thickness of the nitride film is limited to a relatively small value of approximately 3 to 100 nm, the height of the steps can be reduced or minimized, and the possibility of a decrease in contrast or the like can be reduced.

In another exemplary embodiment of the present invention, the electro-optical device further includes a second substrate which is opposed to the first substrate with an electro-optical material therebetween, and a light-shielding film disposed above the second substrate at a position corresponding to the scanning lines and the data lines. The width of the nitride film is smaller than the width of the light-shielding film.

In this exemplary embodiment, the width of the nitride film is smaller than the width of the light-shielding film. That is, in a plan view, the nitride film is covered with the light-shielding film. Herein, the light-shielding film usually reduces or prevents light transmission so that mixture of light between pixels is avoided and the contrast of an image is enhanced. Therefore, by disposing the nitride film so as to be covered with the light-shielding film, the overall transmittance of the electro-optical device can be properly maintained.

Although the light-shielding film is formed on "the second substrate" in this exemplary embodiment, the present invention is not limited thereto. For example, a construction may be designed in which instead of the light-shielding film in this exemplary embodiment, another light-shielding film may be provided on the first substrate (not on "the second substrate"). In such a case, as described above, the TFTs, storage capacitors, scanning lines, and data lines, etc., and the interlayer insulating films isolating these components from each other are provided above the first substrate, and another light-shielding film is considered to be one of such components. By placing another light-shielding film between the interlayer insulating films, it may be considered as a so-called embedded light-shielding film.

This exemplary embodiment of the present invention is of course applicable to an electro-optical device which includes a shielding film provided above the second substrate and another shielding film provided above the first substrate.

More preferably, the width of the nitride film is smaller than the width of the light-shielding film by 1 $\mu$m or less at each edge.

In such a construction, the width of the nitride film is properly set with respect to the width of the light-shielding film, and the effect of maintaining the transmittance of the electro-optical device is achieved more reliably.

In another exemplary embodiment of the present invention, the electro-optical device further includes a second substrate which is opposed to the first substrate with an electro-optical material therebetween, and a light-shielding film disposed above the second substrate at a position corresponding to the scanning lines and the data lines. The width of the nitride film is larger than the width of the light-shielding film.

In this exemplary embodiment, it is possible to reduce flickering in images. Although the exact reason for this is not clear, the intrinsic refractive index of the nitride film is considered to refract incident light passing aside the light-shielding film. That is, light which falls upon the relatively wide sections of the nitride film is refracted by those sections, and the traveling path of the light is changed. The light which is supposed to enter the thin film transistors is diverted to somewhere else. Consequently, in this exemplary embodiment, it is possible to reduce incident light to the thin film transistors, thereby reducing photoelectric leakage current, resulting in a reduction in flickering.

From the viewpoint described above, the larger width of the nitride film is considered to be advantageous. However, if the width of the nitride film becomes too large, the nitride film extends to the light transmission regions, and the overall transmittance of the electro-optical device is decreased, resulting in a degradation in image quality. Therefore, there is a limitation in the extent of the difference in width between the nitride film and the light-shielding film, and more specifically, the distance between an edge of the light-shielding film and an edge of the nitride film in the same side is preferably approximately 1.7 $\mu$m.

It should be understood that the effects of the present invention are also achieved in the structure in which the width of the nitride film is set larger than the width of the data line. In such a case, the light to be refracted corresponds to "light passing aside the data lines".

In another exemplary embodiment of the present invention, the nitride film is formed by a plasma enhanced CVD process.

In this exemplary embodiment, the nitride film of the present invention can be properly formed on the data lines which are usually composed of aluminum or the like to ensure high electric conductivity. Since the melting point of aluminum is low, if the nitride film is formed by a process which requires a high-temperature environment, there is a possibility that the data lines are melted.

In this exemplary embodiment, since the nitride film is formed by a plasma enhanced CVD process, the formation of the nitride film can be performed in a relatively low-temperature environment, and the inconvenience described above does not occur.

In another aspect of the present invention, in order to address or overcome the above, an electronic apparatus includes the electro-optical device of the present invention (or any one of the exemplary embodiments) described above.

In accordance with the present invention, since the electronic apparatuses include the electro-optical devices described above, it is possible to provide various types of electronic apparatuses, such as projection displays (liquid crystal projectors), liquid crystal televisions, mobile phones, electronic pocket diaries, word processors, viewfinder type or monitor-direct-view type video tape recorders, workstations, television telephones, POS terminals, and touch panels, for example, in which images of high quality can be displayed over a relatively long period of time.

The effects described above and further advantages of the present invention will become apparent from the following description of the exemplary embodiments.

DETAILED DESCRIPTION OF PREFERRED EMBODIMENTS

Exemplary embodiments of the present invention are described with reference to the drawings. In the exemplary embodiments, electro-optical devices of the present invention are applied to liquid crystal displays.

(Structure of Pixel Region)

Figure 1:
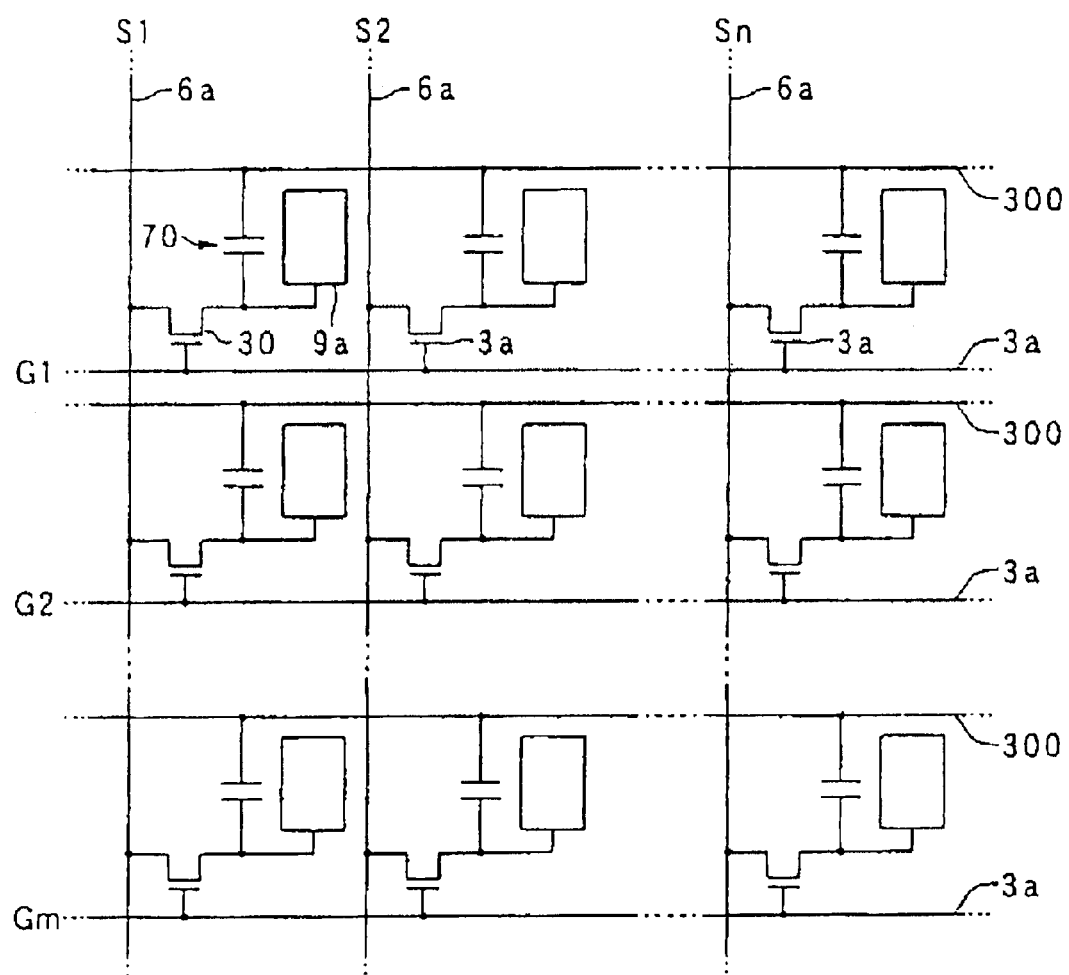
FIG. 1 is a schematic circuit diagram which shows an equivalent circuit including various elements, lines, etc., provided on a plurality of pixels formed in a matrix which constitute the image display region in an electro-optical device in an exemplary embodiment of the present invention.
Figure 2:
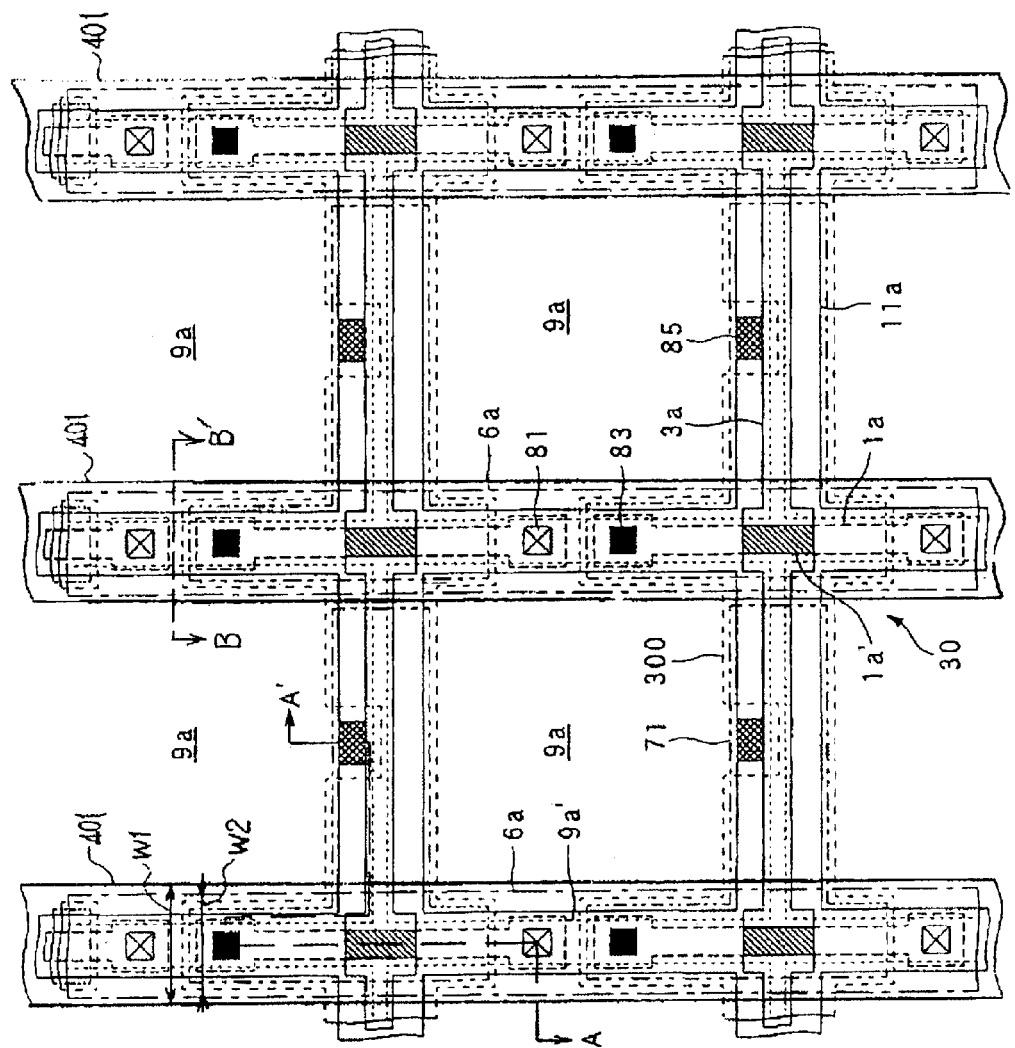
FIG. 2 is a plan view which shows a plurality of pixels placed adjacent to each other on a TFT array substrate provided with data lines, scanning lines, pixel electrodes, etc., in an electro-optical device in an exemplary embodiment of the present invention.
Figure 3:
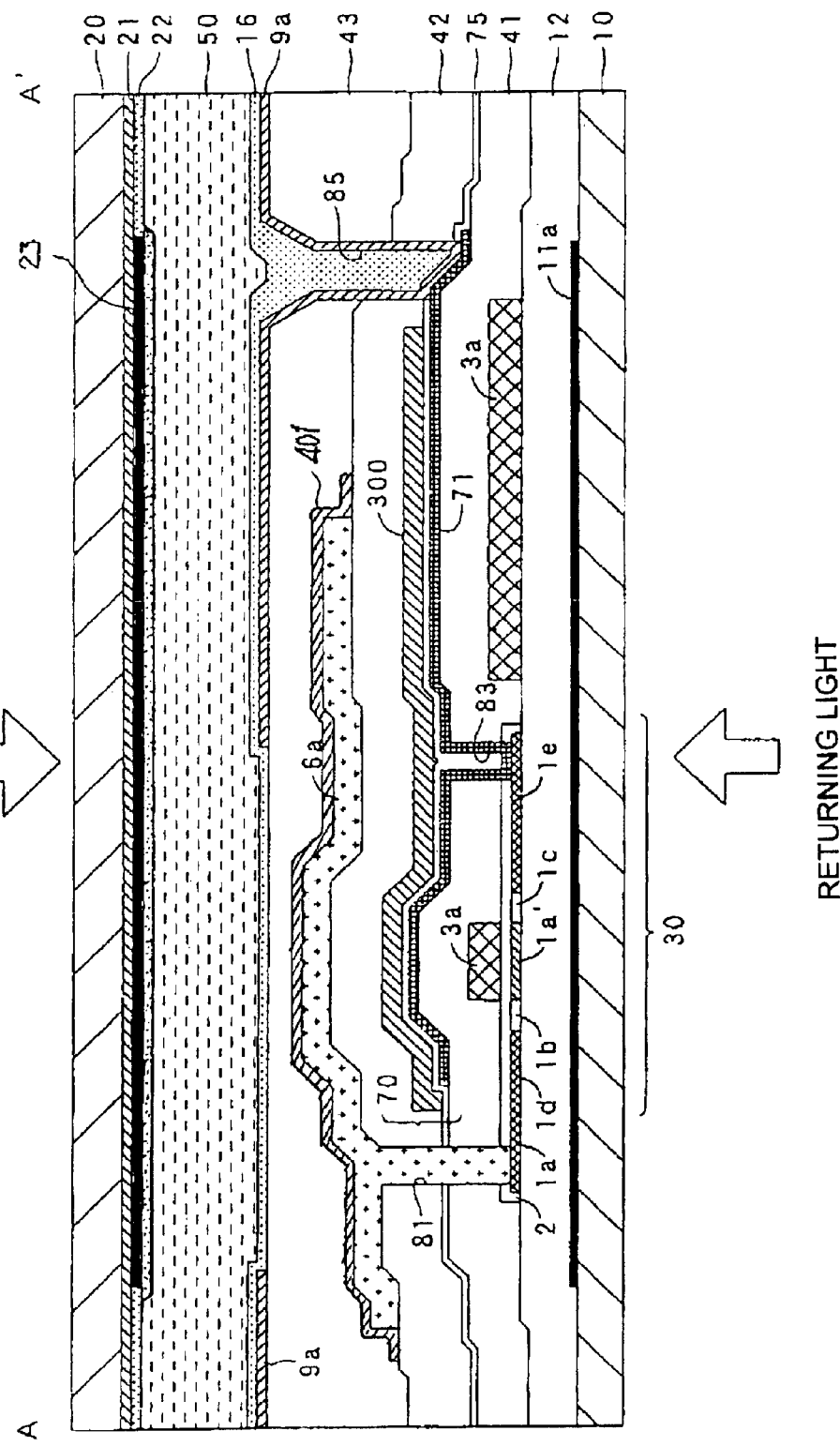
FIG. 3 is a sectional view taken along plane A–A' of FIG. 2.
Figure 4:
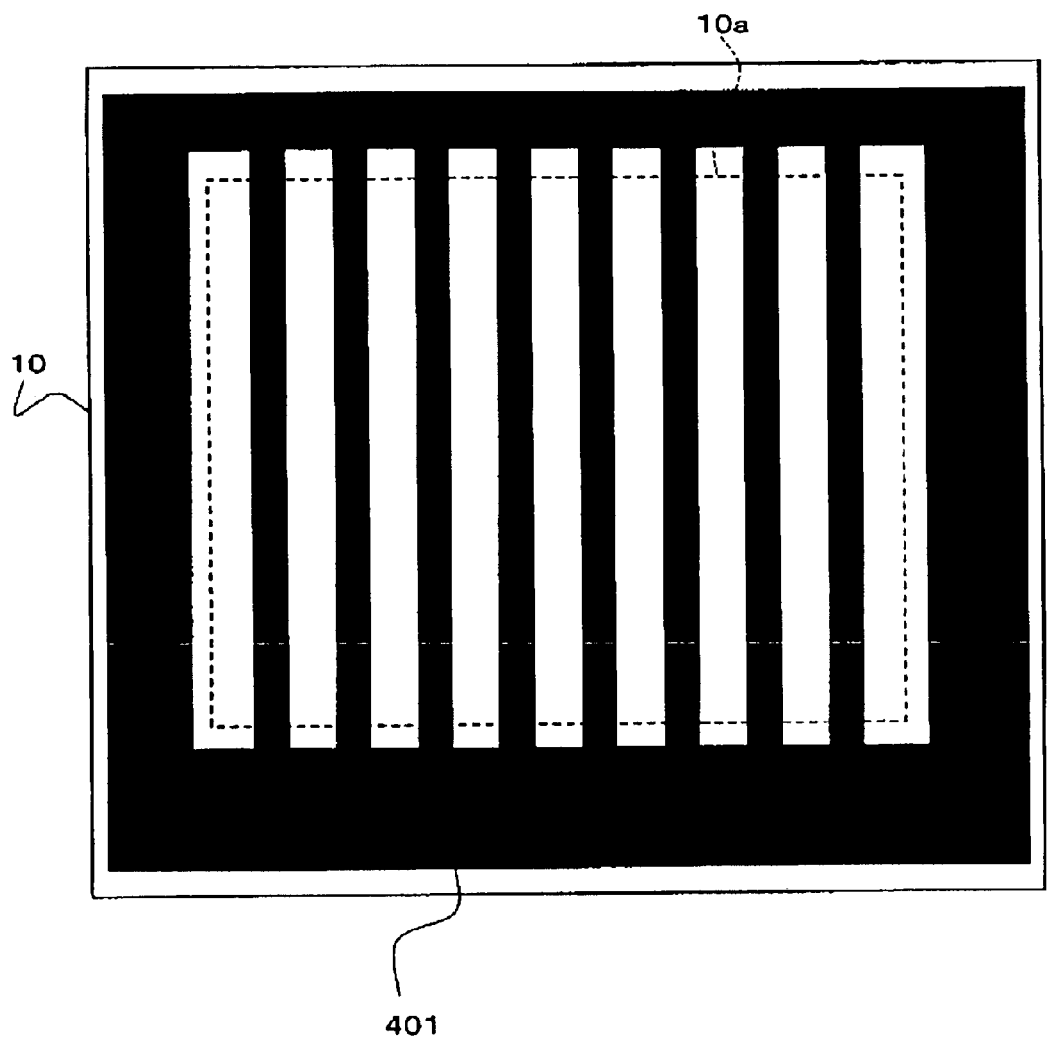
FIG. 4 is a plan view which schematically shows an overall structure of a nitride film on a TFT array substrate in an exemplary embodiment of the present invention.
Figure 5:
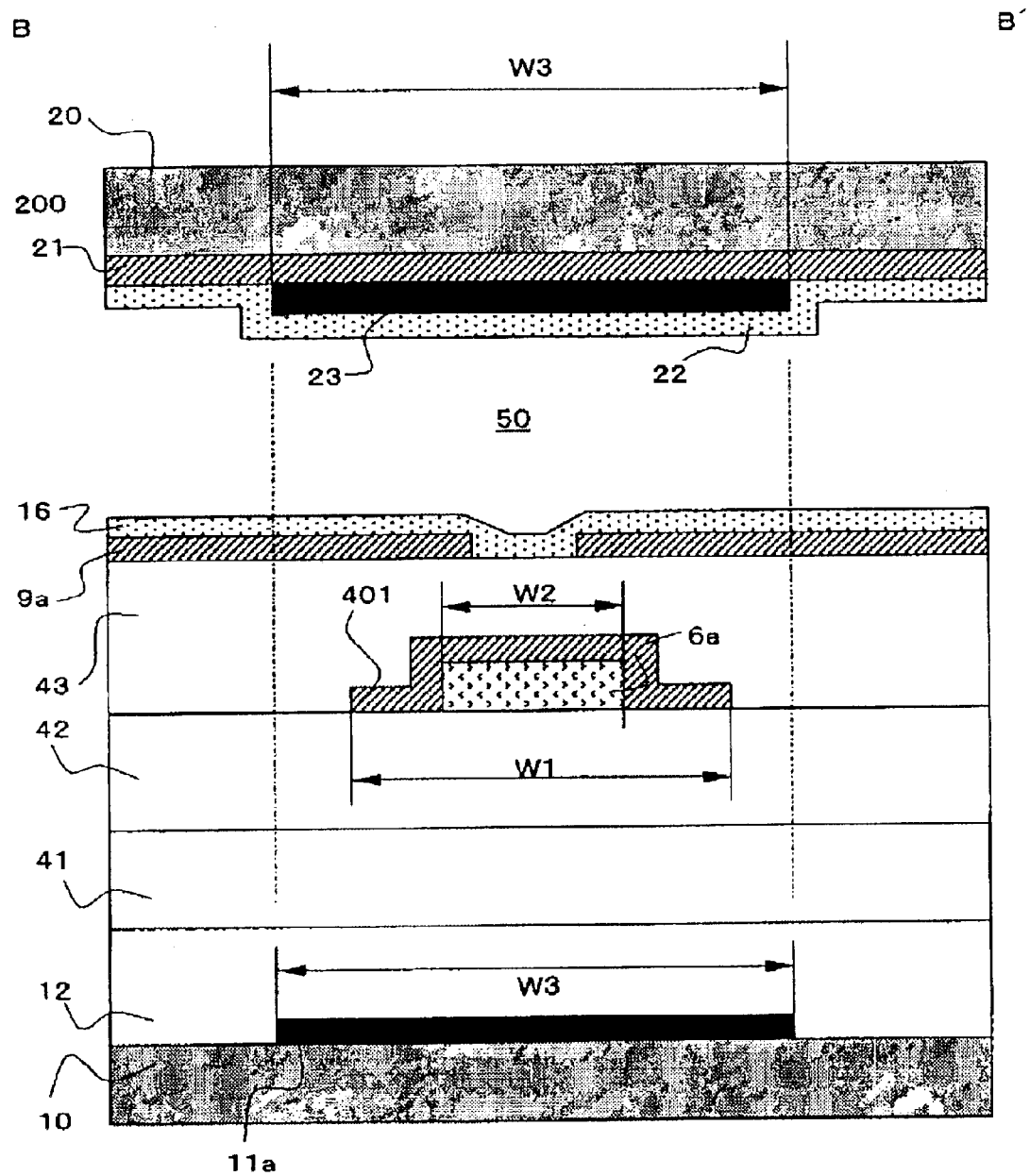
FIG. 5 is a sectional view taken along plane B–B' of FIG. 2.

First, the structure of a pixel region of an electro-optical device in a first exemplary embodiment of the present invention is described with reference to FIGS. 1 to 5. FIG. 1 is a schematic circuit diagram which shows an equivalent circuit including various elements, lines, etc., provided on a plurality of pixels formed in a matrix which constitute the image display region in an electro-optical device. FIG. 2 is a plan view which shows a plurality of pixels placed adjacent to each other on a TFT array substrate provided with data lines, scanning lines, pixel electrodes, etc. FIG. 3 is a sectional view taken along plane A–A' of FIG. 2, and FIG. 5 is a sectional view taken along plane B–B' of FIG. 2. Furthermore, FIG. 4 is a plan view which schematically shows an overall structure of a nitride film on the TFT array substrate in this exemplary embodiment. In FIGS. 3 and 5, in order to make the individual layers and components to be recognizable in the drawings, different scale sizes are used for the individual layers and components.

Referring to FIG. 1, in each of the plurality of pixels formed in a matrix which constitute the image display region of the electro-optical device in this exemplary embodiment, a pixel electrode $9a$ and a TFT $30$ to switch the pixel electrode $9a$ are formed. A data line $6a$ for being supplied with image signals is electrically connected to the source of the TFT $30$. Image signals S1, S2, . . . , Sn to be written into the data lines $6a$ may be supplied in that order line by line, or the image signals may be supplied to a plurality of data lines $6a$ adjacent to each other group by group.

A scanning line $3a$ is electrically connected to the gate of the TFT $30$, and scanning signals G1, G2, . . . , Gm are supplied in that order line by line in a pulsed form. The pixel electrode $9a$ is electrically connected to the drain of the TFT $30$. The pixel electrodes $9a$ write the image signals S1, S2, . . . , Sn supplied from the data lines $6a$ at a predetermined timing by turning off the TFTs $30$ which are switching elements for a certain period.

The image signals S1, S2, . . . , Sn written at a predetermined level into the liquid crystal which is an example of the electro-optical material through the pixel electrodes $9a$ are retained for a certain period in the spaces between the liquid crystal and the counter electrode formed on the counter substrate. Since the alignment of the molecular assembly and the order of the liquid crystal are changed in response to the level of the voltage applied, light is modulated, thus achieving a gray scale display. In the normally white mode, the transmittance to incident light is decreased in response to the voltage applied for each pixel, and in the normally black mode, the transmittance to incident light is increased in response to the voltage applied for each pixel, and overall, light having a contrast corresponding to the image signals is emitted from the electro-optical device.

In order to reduce or avoid the leakage of the retained image signals, storage capacitors $70$ are added parallel to the liquid crystal capacitors formed between the pixel electrodes $9a$ and the counter electrode. The storage capacitors $70$ include capacitor lines $300$, which are provided along the scanning lines $3a$ and which include capacitor electrodes on the fixed potential side of the storage capacitors and which are fixed at a constant potential.

Next, the structure of the electro-optical device in which the circuit operation by the data lines $6a$, the scanning lines $3a$, the TFTs $30$, etc., described above is conducted is described in detail with reference to FIGS. 2 and 3.

As shown in FIG. 3 which is a sectional view taken along plane A–A' of FIG. 2, in this exemplary embodiment, the electro-optical device includes a transparent TFT array substrate $10$ and a transparent counter substrate $20$ which is opposed thereto. The TFT array substrate $10$ is composed of, for example, a quartz substrate, a glass substrate, or a silicon substrate, and the counter substrate $20$ is composed of, for example, a glass substrate or a quartz substrate.

As shown in FIG. 3, the pixel electrode $9a$ is provided on the TFT array substrate $10$. An alignment layer $16$ which has been subjected to predetermined alignment treatment, such as rubbing treatment, is provided on the upper surface of the pixel electrode $9a$. The pixel electrode $9a$ is composed of a transparent conductive film, such as an indium tin oxide (ITO) film. On the other hand, provided on the counter substrate $20$ are a counter electrode $21$ on the entire surface thereof and an alignment layer $22$ which has been subjected to predetermined alignment treatment, such as rubbing treatment, disposed under the counter electrode $21$. The counter electrode $21$ is also composed of a transparent conductive film, such as an ITO film, as in the case of the pixel electrode $9a$. The alignment layers $16$ and $22$ are composed of transparent organic films, such as polyimide films.

An upper light-shielding film $23$ is provided on the counter substrate $20$ so as to weave between the pixel electrodes $9a$ arrayed in a matrix which will be described below. The upper light-shielding film $23$ is, for example, composed of an elemental metal selected from the group including Ti (titanium), Cr (chromium), W (tungsten), Ta (tantalum), Mo (molybdenum), and Pd (palladium), which are opaque high-melting-point metals, or an alloy or a metal silicide containing at least one of them, for example. Alternatively, the upper shielding film $23$ may be composed of other metals, such as Al (aluminum) or Ag (silver), for example. The upper light-shielding film $23$ delimits aperture regions, and light cannot pass through the regions in which the upper light-shielding film $23$ is present. Thereby, light mixing between the pixels is prevented, and the image contrast is enhanced.

As shown in FIG. 2, a plurality of pixel electrodes 9a are disposed in a matrix on the TFT array substrate 10 (outlined by dashed lines 9a'), and the data lines 6a and the scanning lines 3a are provided along the vertical and horizontal borderlines of the pixel electrodes 9a.

In this exemplary embodiment, in particular, a nitride film 401, for example, composed of a SiN film or a SiON film, is provided on and along the data lines 6a composed of a metal film, such as an aluminum film, or an alloy film. Besides on the data lines 6a, the nitride film 401 is also formed in a rectangular frame shape around an image display region 10a in which the pixel electrodes 9a arrayed in a matrix and the data lines 6a and the scanning lines 3a disposed so as to weave between the pixel electrodes 9a are formed.

As described above, the nitride film 401 in this exemplary embodiment is formed on the TFT array substrate 10 in an overall shape as schematically shown in FIG. 4. In FIG. 4, the nitride film 401 in the periphery of the image display region 10a greatly contributes to the reduction or prevention of moisture entry into complementary TFTs or complementary MOS (CMOS) TFTs constituting a data line drive circuit 101 and a scanning line drive circuit 104 which is described below (refer to FIG. 10). With respect to nitrides, the etching rate in dry etching or the like is considered to be smaller compared to other commonly used materials. Therefore, when the nitride film 401 is formed in the peripheral region of the image display region 10a and when contact holes or the like must be formed in the peripheral region, holes corresponding to the positions of the contact holes are preferably formed in the nitride film 401 preliminarily. If the holes are formed in the patterning step to form the shape shown in FIG. 4, the fabrication process is simplified.

With respect to the nitride film 401 disposed on the data lines 6a, as shown in FIG. 2, the width of the nitride film 401 is slightly larger than the width of the data line 6a and is substantially same as or slightly smaller than the width of the upper light-shielding film 23. In this exemplary embodiment, the width W1 of the nitride film 401 is larger than the width W2 of the data line 6a by 0.1 to 0.5 $\mu$m for each edge, i.e., the relationship (W1−W2)/2=0.1 to 0.5 $\mu$m is satisfied.

In a plan view from the counter substrate 10, the data line 6a is covered with the nitride film 401, and the nitride film 401 is covered with the upper light-shielding film 23.

In this exemplary embodiment, as a component to delimit the aperture region, in addition to the upper light-shielding film 23, as shown in FIG. 3, a lower light-shielding film 11a is provided on the TFT array substrate 10 and below the TFT 30. The lower light-shielding film 11a is patterned in a grid shape, by which the aperture region of each pixel is also delimited. Additionally, the lower light-shielding film 11a is preferably extended from the image display region to the periphery thereof and connected to a constant potential source so as to reduce or prevent the change in the potential from adversely affecting the TFTs 30, as in the case of the capacitor lines 300 which is described below.

If the capacitor lines 300 which are formed so as to intersect with the data lines 6a are composed of a light shielding material, the aperture regions can be delimited by the data lines 6a and the capacitor lines 300. The lower light-shielding film 11a or the data lines 6a and the capacitor lines 300 formed between interlayer insulating films on the substrate 10 on which the TFT array is formed may be referred to as "embedded light-shielding films".

In this exemplary embodiment, in particular, the width of the lower light-shielding film 11a is the same as the width of the upper shielding film 23, i.e., both light-shielding films have the same width W3. As a result, the width W1 of the nitride film 401 is the same as or smaller than the width W3 of the lower light-shielding film 11a. Consequently, the nitride film 401 in this exemplary embodiment is present only in the non-aperture region.

In this exemplary embodiment, as described above, the width of the lower light-shielding film 11a is the same as the width of the upper light-shielding film 23. The present invention is not limited to such a structure. For example, the width of the lower light-shielding film 11a may be smaller than the width of the upper light-shielding film 23. In such a case, light which travels obliquely in the electro-optical device can be prevented from being reflected or such reflection can be reduced, and light shielding capability with respect to the TFTs 30 can be enhanced.

The structure of the electro-optical device in this exemplary embodiment is summarized in FIG. 5 which is a sectional view taken along plane B–B' of FIG. 2. In FIG. 5, as described above, the width W1 of the nitride film 401 is larger than the width W2 of the data line 6a, and is the same as or smaller than the width W3 of the upper light-shielding film 23 or the lower light-shielding film 11a. This means that the edges of the nitride film 401 do not extend to the light transmission regions. In FIG. 5, the right and left dotted-chain lines separated with a distance corresponding to the width W3 of the upper light-shielding film 23 or the lower light-shielding film 11a delimit the light transmission regions from others. The nitride film 401 does not extend beyond the right (or left) dotted-chain line. That is, the edges of the nitride film 401 do not reach the light transmission regions.

The nitride film 401 can be properly formed, for example, by a plasma enhanced CVD process. By forming the nitride film 401 by such a process in which film deposition is enabled in a lower-temperature environment, even if the data lines 6a are composed of a low-melting-point metal, such as aluminum, the data lines 6a are not melted, and the nitride film 401 can be formed satisfactorily. In the present invention, the nitride film 401 may be formed by a method other than the one described above.

The thickness of the nitride film 401 is preferably about 3 to 100 nm, and more preferably about 3 to 30 nm.

Referring back to FIG. 2, the scanning line 3a is placed so as to face channel regions 1a' which are the upward-hatched sections shown in FIG. 2, and a portion of the scanning line 3a functions as a gate electrode. At each intersection of the scanning lines 3a and the data lines 6a, a TFT 30 to switch the pixel is provided in which the scanning line 3a acting as the gate electrode is placed so as to face the channel region 1a'.

As shown in FIG. 3, the TFT 30 has a lightly doped drain (LDD) structure. The TFT 30 includes the scanning line 3a which acts as the gate electrode as described above, a channel region 1a' of a semiconductor layer 1a which is, for example, composed of a polysilicon film and in which a channel is formed by an electric field from the scanning line 3a, and an insulating film 2 including a gate insulating film which insulates the scanning line 3a from the semiconductor layer 1a, and the TFT 30 also includes a low-concentration source region 1b, a low-concentration drain region 1c, a high-concentration source region 1d, and a high-concentration drain region 1e of the semiconductor layer 1a.

The TFT 30 preferably has a LDD structure as shown in FIG. 3. The TFT 30 may have an offset structure in which impurity implantation is not performed on the low-concentration source region 1b and the low-concentration drain region 1c. Alternatively, a TFT of the self-aligned type may be used in which an impurity is implanted at a high concentration using the gate electrode which is a part of the scanning line 3a as a mask to form a high-concentration source region and a high-concentration drain region in a self-alignment manner. In this exemplary embodiment, the TFT 30 to switch the pixel has a single gate structure in which only one gate electrode is placed between the high-concentration source region 1d and the high-concentration drain region 1e. Instead of this, two or more gate electrodes may be placed. By constructing the TFT so as to have dual gates, or triple or more gates, current leakage can be reduced or prevented at the junctions between the channel region and the source region and between the channel region and the drain region, thus enabling a reduction in current in the off state. Furthermore, the semiconductor layer 1a constituting the TFT 30 may be composed of a non-monocrystalline layer or a monocrystalline layer. In order to form a monocrystalline layer, a known method, such as a bonding method, or a related art or later developed method may be used. If the semiconductor layer 1a is composed of a monocrystalline layer, in particular, the performance of the peripheral circuits can be enhanced.

Referring to FIG. 3, the storage capacitor 70 is formed in which an intermediary layer 71, which functions as the capacitor electrode on the pixel potential side and which is connected to the high-concentration drain region 1e of the TFT 30 and the pixel electrode 9a, and a portion of the capacitor line 300 which functions as the capacitor electrode on the fixed potential side are placed so as to be opposed to each other with a dielectric film 75 therebetween. In the storage capacitor 70, the potential retention capacity in the pixel electrode 9a can be remarkably increased.

The intermediary layer 71 is, for example, composed of a conductive polysilicon film and functions as the capacitor electrode on the pixel potential side. The intermediary layer 71 may be composed of a single-layer film or multi-layer film containing a metal or alloy as in the case of the capacitor line 300 which is described below. In addition to the function as the capacitor electrode on the pixel potential side, the intermediary layer 71 also has a function of connecting the pixel electrode 9a to the high-concentration drain region 1e of the TFT 30 through contact holes 83 and 85.

If the intermediary layer 71 as described above is used, even if the interlayer distance is long, for example, approximately 2,000 nm, both layers can be satisfactorily connected to each other through two or more series contact holes having a relatively small diameter while avoiding technical difficulty in connecting both layers through one contact hole, and the pixel aperture ratio can be increased. The intermediary layer 71 is also useful in preventing excessive etching when the contact holes are opened.

The capacitor line 300 is composed of a conductive film containing a metal, alloy, or the like, and functions as the capacitor electrode on the fixed potential side. The capacitor line 300 overlaps with the region in which the scanning line 3a is formed in a plan view as shown in FIG. 2. More specifically, the capacitor line 300 include a main line which extends along the scanning line 3a, protruding sections which protrude from the intersection with the data line 6a upward and downward along the data line 6a, and narrow sections which slightly narrow at the positions corresponding to the contact holes 85. The protruding section contributes to the increase in the region to form the storage capacitor 70 using a region above the scanning line 3a and a region below the data line 6a.

The capacitor line 300 is preferably composed of a conductive light-shielding film containing a high-melting-point metal, and functions as a light shielding layer to shield the TFT 30 from incident light, in addition to the function as the capacitor electrode on the fixed potential side of the storage capacitor 70. As described above, by forming the capacitor line 300 so as to have such a structure, the capacitor line 300 can also be used as an embedded light-shielding film which delimits the aperture regions.

The capacitor line 300 preferably extends from the image display region 10a in which the pixel electrodes 9a are placed to the periphery thereof, and is electrically connected to a constant potential source so as to have a fixed potential. As the constant potential source, a constant potential source of positive or negative power supplied to a data line drive circuit 101, or a constant potential supplied to the counter electrode 21 on the counter substrate 20 may be used.

As shown in FIG. 3, the dielectric film 75 is, for example, composed of a silicon oxide film, such as a high temperature oxide (HTO) film or a low temperature oxide (LTO) film, a silicon nitride film, or the like, with a relatively small thickness of approximately 5 to 200 nm. In order to increase the storage capacitor 70, if satisfactory film reliability is obtained, the thickness of the dielectric film 75 is preferably decreased as much as possible.

Referring to FIGS. 2 and 3, an insulating underlayer 12 is also provided under the TFTs 30. The insulating underlayer 12 insulates the lower light-shielding film 11a from the TFTs 30. Since the insulating underlayer 12 is formed on the entire surface of the TFT array substrate 10, the insulating underlayer 12 also avoids the changes in characteristics of the TFTs 30 to switch pixels due to roughness during surface polishing of the TFT array substrate 10, contaminants remaining after cleaning, etc.

A first interlayer insulating film 41 is formed on the scanning line 3a. A contact hole 81 leading to the high-concentration source region 1d and the contact hole 83 leading to the high-concentration drain region 1e are formed in the first interlayer insulating film 41.

The intermediary layer 71 and the capacitor line 300 are formed on the first interlayer insulating film 41, and a second interlayer insulating film 42 is formed thereon. The contact hole 81 leading to the high-concentration source region 1d and the contact hole 85 leading to the intermediary layer 71 are formed in the second interlayer insulating film 42.

In this exemplary embodiment, by firing the first interlayer insulating film 41 at approximately 1,000° C., ions implanted into polysilicon films constituting the semiconductor layer 1a and the scanning line 3a may be activated. On the other hand, by not firing the second interlayer insulating film 42, stress occurring in the vicinity of the interfaces with the capacitor line 300 may be relieved.

The data line 6a and the nitride film 401 in this exemplary embodiment are formed on the second interlayer insulating film 42, and a third interlayer insulating film 43 provided with the contact hole 85 leading to the intermediary layer 71 is formed further thereon.

The surface of the third interlayer insulating film 43 is planarized by chemical mechanical polishing (CMP) or the like, thereby reducing alignment defects of a liquid crystal layer 50 due to the steps resulting from various lines and elements placed therebelow. Instead of or in addition to such planarization treatment, a trench may be formed in at least one of the TFT array substrate 10, the insulating underlayer 12, the first interlayer insulating film 41, and the second interlayer insulating film 42 so that the lines, such as the data line 6a, the TFT 30, etc., are embedded in the trench to planarize the surface.

In the electro-optical device having the structure described above in this exemplary embodiment, because of the presence of the nitride film 401, the following effects are obtained.

First, by providing the nitride film 401 in the periphery of the image display region 10a and on the data line 6a, it is possible to reduce or prevent moisture from entering the semiconductor layer 1a and the insulating film 2 including the gate insulating film which constitute the TFT 30. Consequently, unlike the related art case, it is possible to reduce or prevent the situation in which the threshold voltage Vth of the TFT 30 increases in a relatively short period of time and the TFT 30 becomes uncontrollable.

In this exemplary embodiment, the nitride film 401 is present only on the data lines 6a excluding the portion of the nitride film 401 disposed in the periphery of the image display region 10a and is formed so as not to extend to the light transmission regions (refer to FIG. 5). Consequently, in spite of the presence of the nitride film 401, a decrease in the overall transmittance of the electro-optical device can be reduced or prevented. Therefore, in this exemplary embodiment, it is possible to display a brighter image with high quality.

For the same reason, it is possible to reduce or prevent the nitride film itself from being broken due to its internal stress. It is also possible to reduce or prevent cracks from occurring in the other components (e.g., the third interlayer insulating film 43) near the nitride film 401 under the influence of the internal stress. That is, since the nitride film 401 is present only on the data lines 6a, a large amount of internal stress is not concentrated. Such an effect is more apparent if compared with the case in which a nitride film is provided over the entire surface of the TFT array substrate 10.

Moreover, in this exemplary embodiment, even with such a structure, the effect of reducing or preventing moisture entry is obtained satisfactorily. The present inventors have confirmed that even when the nitride film 401 with a thickness of 3 to 30 nm is formed only on the data lines 6a, the life of the electro-optical device can be prolonged by approximately three times compared with the related art electro-optical device.

Furthermore, in this exemplary embodiment, as shown in FIG. 2 or 5, the width W1 of the nitride film 401 is larger than the width W2 of the data line 6a (W1>W2). Consequently, it is possible to reduce damage to the data lines 6a occurring in the fabrication process. Herein, as described above, damage due to an etching step performed in photolithography is typically considered as the damage in the fabrication process. In such a case, if the data lines 6a are unnecessarily eroded by the etching step, the operation of the electro-optical device may be affected.

However, in this exemplary embodiment, since the relationship W1 (width of the nitride film 401>W2 (width of the data line 6a) is satisfied, the edges of the nitride film 401 are subjected to damage due to etching. Consequently, in this exemplary embodiment, it is possible to provide an electro-optical device which can be operated properly without the erosion of the data lines 6a, etc.

Figure 6:
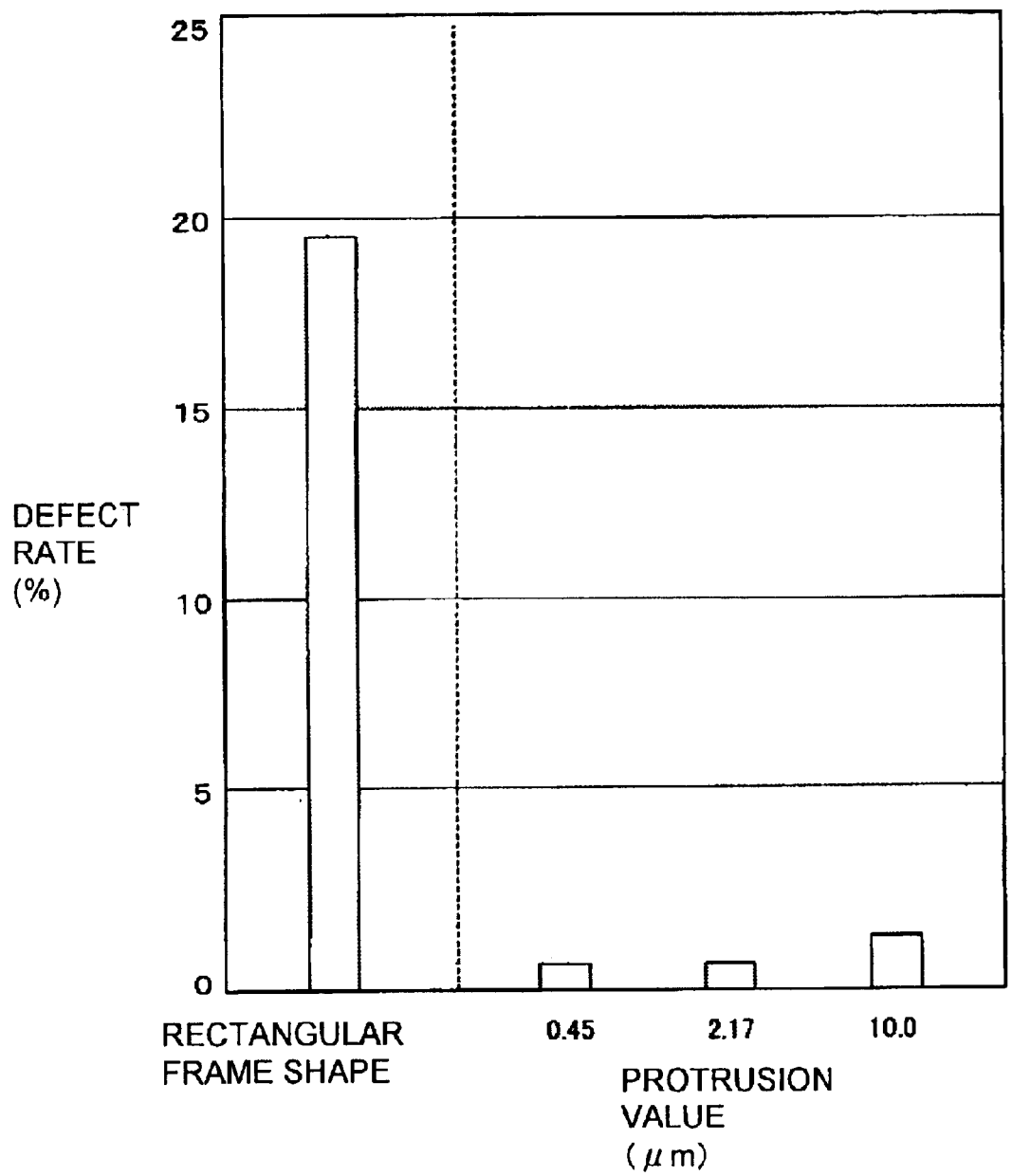
FIG. 6 is a graph which shows a relationship between various patterns of nitride films having different forms and the defect rate of electro-optical apparatuses fabricated on experimental basis using the respective nitride films.

FIG. 6 is a graph showing the test results which demonstrates the above effect. The graph shows how the defect rate of the electro-optical device varies when an original nitride film is formed over the entire surface of the TFT array substrate 10, and is then subjected to patterning to form various shapes. Herein, the "defect rate" refers to the rate of the number of electro-optical devices in which abnormal operation is observed due to the breakage of the data lines 6a to the total number of electro-optical devices tested. The "patterning to form various shapes" means that specifically, three shapes are formed with protrusion values P of 0.45 µm, 2.17 µm, and 10 µm, where the protrusion value P is obtained by (width W1 of nitride film 401)−(width W2 of data line 6a)/2, i.e., protrusion value P=(W1−W2)/2.

As is obvious from FIG. 6, in the case (leftmost in the graph) in which the entire surface of the nitride film, excluding a rectangular frame shaped periphery, is etched, the defect rate is approximately 20%. In contrast, in any one of the cases in which the nitride film 401 is patterned so as to be left on the data line 6a and the width W1 of the nitride film 401 is larger than the width W2 of the data line 6a, the defect rate is remarkably low.

As described above, by satisfying the relationship W1>W2, it is possible to provide an electro-optical device in which reliable operation is expected.

In the exemplary embodiment described above, the widths W1 and W2 are set so that protrusion value P=0.1 to 0.5 µm. The reason for this is obvious from FIG. 7, which is a graph which shows how flickering varies with the change in the protrusion value P, the flickering appearing in an image displayed by the finished etectro-optical device.

Figure 7:
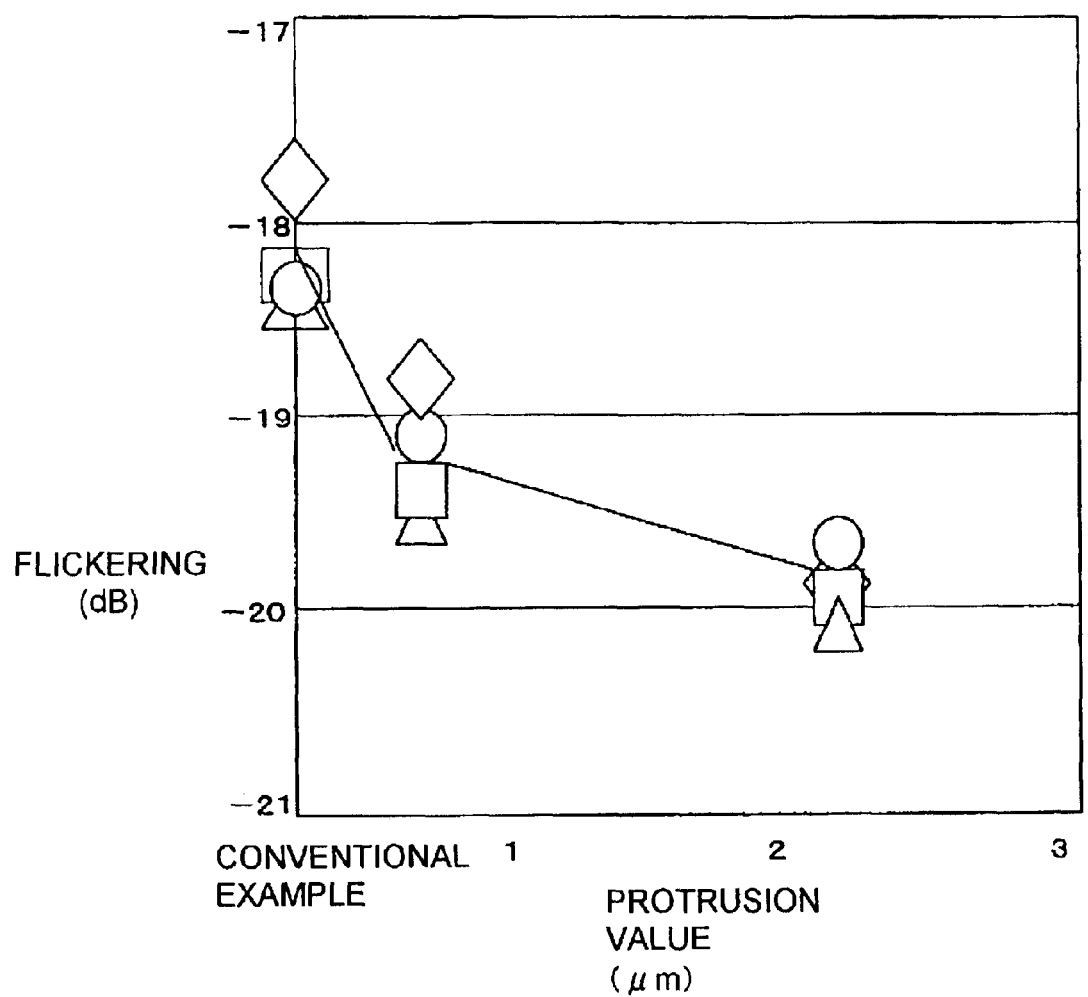
FIG. 7 is a graph which shows a relationship between the protrusion value and the degree of flickering of images.

As is clear from FIG. 7, compared with the related art example (shown on the left axis in the graph) in which no nitride film is present on the data line 6a, in the case in which the nitride film 401 in this embodiment is formed, flickering in the image is reduced. The rate of reduction increases as the protrusion value P increases. That is, as the protrusion value P increases, flickering decreases.

Although the exact reason for this is not clear, the intrinsic refractive index of the nitride film 401 is considered to refract incident light passing aside the data line 6a. That is, light that falls upon the relatively wide sections of the nitride film 401 is refracted by those sections, and the traveling path of the light is changed. The light which is supposed to enter the TFT 30 is diverted to somewhere else. Since the amount of incident light to the TFT 30 is decreased, photoelectric leakage current is reduced, resulting in a reduction in flickering.

It is obvious from FIG. 7 that just a small protrusion value provides the effect of flickering reduction relatively sufficiently. Therefore, preferably, the lower limit of the protrusion value P is decreased or decreased as much as possible (refer to FIG. 7), and more specifically, the lower limit is approximately 0.1 µm or more. Incidentally, if the protrusion value P is set at the lowest possible limit, even if assembling errors or the like occur in the fabrication process, it is not necessary to particularly worry about the nitride film 401 reaching the light transmission regions. This is also an advantage.

With respect to the upper limit of the protrusion value P, it appears from FIG. 7 that, as the protrusion value P increases, flickering decreases, and therefore no restriction is required. However, the protrusion value P should not be increased at random. The reason for this is that, as is clear from FIG. 5, if the protrusion value P is increased excessively, the edges of the nitride film 401 exceed the dotted-chain lines in the drawing, resulting in a decrease in the overall transmittance of the electro-optical device.

Figure 8:
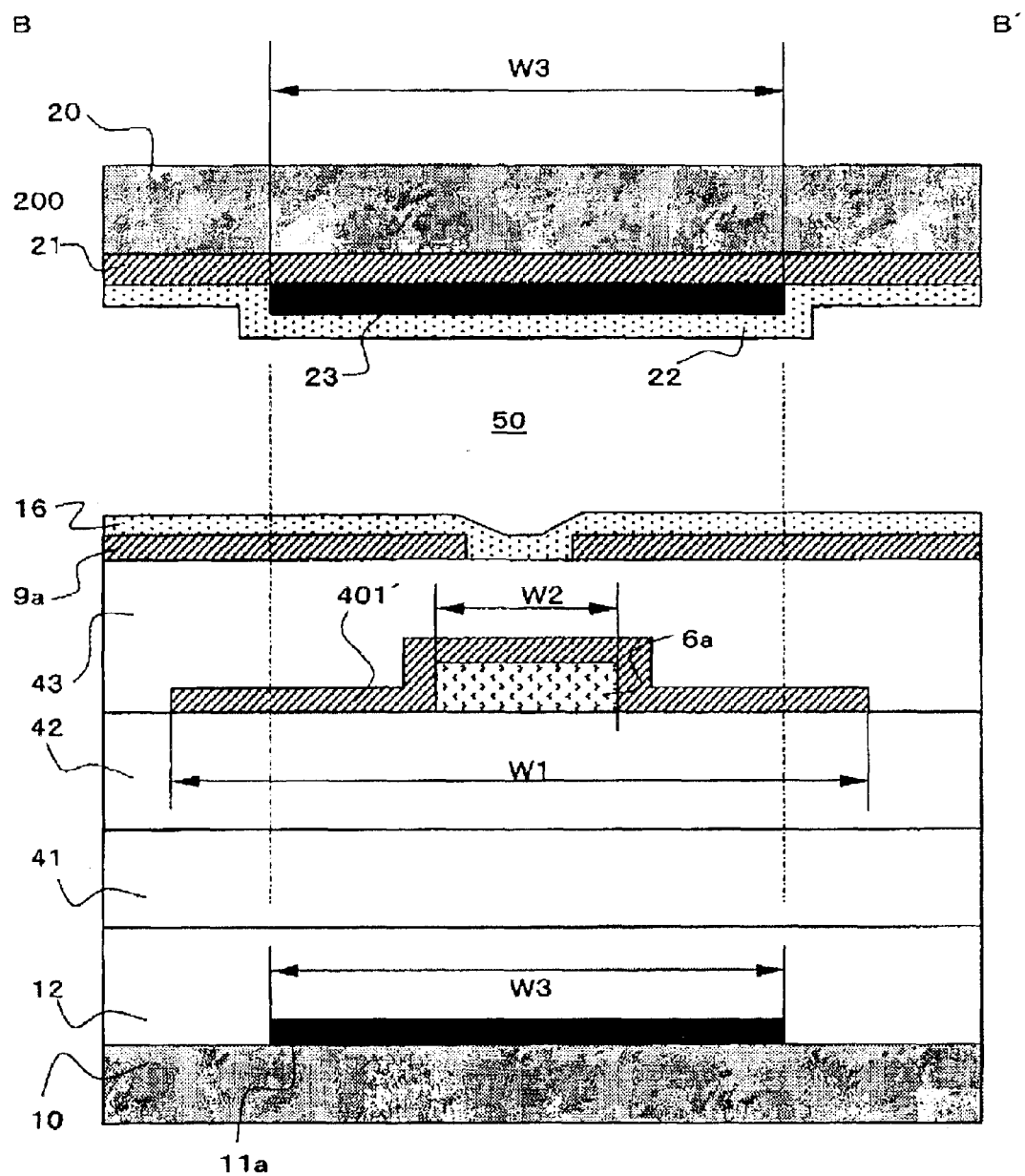
FIG. 8 is a sectional view similar to FIG. 5 except that the width of a nitride film is larger than the width of an upper light-shielding film.

However, in the present invention, it is not necessary to limit the width W1 of the nitride film 401 so that the nitride film 401 does not extend to the light transmission regions formally. For example, in some cases, as shown in FIG. 8, a structure in which the nitride film 401 extends to the light transmission regions may be employed. FIG. 8 is a sectional view taken along plane B–B' of FIG. 2 as in the case of FIG. 5, and FIG. 8 shows a structure in which the width W1' of a nitride film 401' is larger than the width W3 of the upper light-shielding film 23. In FIG. 8, the same components as those in FIG. 5 are represented by the same reference numerals, and a description thereof is omitted.

As shown in FIG. 8, when the width W1' of the nitride film 401' is larger than the width W3 of the upper light-shielding film 23, the nitride film 401' extends to the light transmission regions formally. However, as long as the difference between the width W3 and the width W2 is not substantially large, it is considered that there is a range in which the light transmittance is not substantially affected. In such a case, as described above with reference to FIG. 7, a higher effect of reducing flickering in images may be exhibited compared to the exemplary embodiment described above, and from that point of view, the structure shown in FIG. 8 is more advantageous.

As described above, the upper limit of the width W1 of the nitride film 401 is determined in consideration of the relationship between the avoidance of a reduction in light transmittance and the reduction of flickering in images, which is considered to be a trade-off relationship. More specifically, if much value is placed on the reduction in flickering in images, the protrusion value P is preferably set at a large value of approximately 2.2 µm. If much value is place on the avoidance of a reduction in light transmittance, the protrusion value P is preferably set at a small value of approximately 0.5 µm. In the former case, the width W1 of the nitride film 401 is generally larger than the width W3 of the upper light-shielding film 23, which corresponds to the structure in which portions of the nitride film 401 slightly extend to the light transmission regions (refer to FIG. 8). The latter case corresponds to the structure in which the nitride film 401 does not extend to the light transmission regions (refer to FIG. 5).

However, the upper limit of the protrusion value P is essentially determined depending on the relationship between the nitride film 401 and the data line 6a, the size of the pixel electrode 9a, the width of the scanning line 3a, and the conditions of various other components. Therefore, generally speaking, if much value is placed on the reduction in flickering in images, the width W1 of the nitride film 401 is preferably larger than the width W3 of the upper light-shielding film 23. If much value is placed on the avoidance of a reduction in light transmittance, the nitride film 401 is preferably formed in a region excluding the light transmission regions. Additionally, in the latter case, instead of the relationship between the nitride film 401 and the data line 6a, notice must be taken of the relationship between the nitride film 401 and the upper light-shielding film 23, and the width of the nitride film 401 is preferably limited to be smaller than the width of the upper light-shielding film by 1 µm or less at each edge.

In conclusion, in view of all the conditions described above including the reduction or prevention of etching damage to the data line 6a, the protrusion value P is more preferably in the range of 0.45 to 0.55 µm.

In this exemplary embodiment, since the thickness of the nitride film 401 is approximately 3 to 100 nm, the following effect will be obtained. That is, by using the nitride film 401 with such a relatively small thickness, the height of steps occurring on the surface of interlayer insulating films, etc., formed on the nitride film 401 can be decreased. Therefore, image quality is not degraded due to a decrease in contrast, etc. In this exemplary embodiment, although the planar surface can be obtained by performing CMP treatment on the surface of the third interlayer insulating film 43 as described above, even if the CMP treatment is not performed, it is possible to obtain a relatively planar surface by setting the thickness of the nitride film 401 in the range described above.

Figure 9:
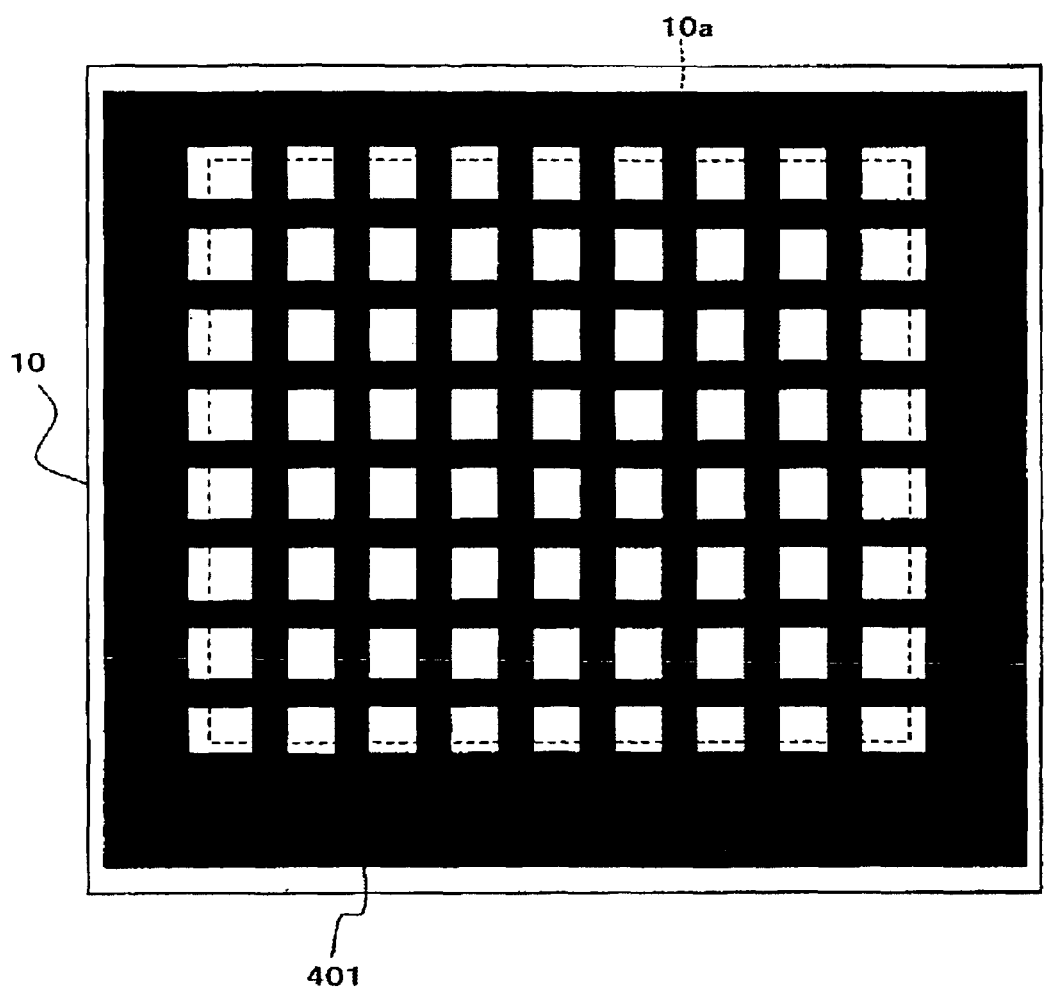
FIG. 9 is a plan view which schematically shows an overall structure, which is different from that shown in FIG. 4, of a nitride film on a TFT array substrate in an exemplary embodiment of the present invention.

In the exemplary embodiment described above, the structure in which the nitride film 401 is present in the periphery of the image display region 10a and on the data lines 6a only. The present invention is not limited to such a structure. For example, as shown in FIG. 9 which is a plan view similar to FIG. 4, the nitride film 401 is also formed in the direction in which the scanning lines 3a extend simultaneously with the formation of the nitride film 401 extending in the data line 6a direction. In such a structure, the effect of reducing or preventing moisture from entering the TFTs 30 is considered to be obtained more reliably. Incidentally, even in such a case, the structure in which the edges of the nitride film 401 do not extend to the light transmission regions (refer to FIG. 5) or the structure in which the edges of the nitride film 401' extend to the light transmission regions (refer to FIG. 8) may also be used.

(Overall Structure of Electro-optical Device)

Figure 10:
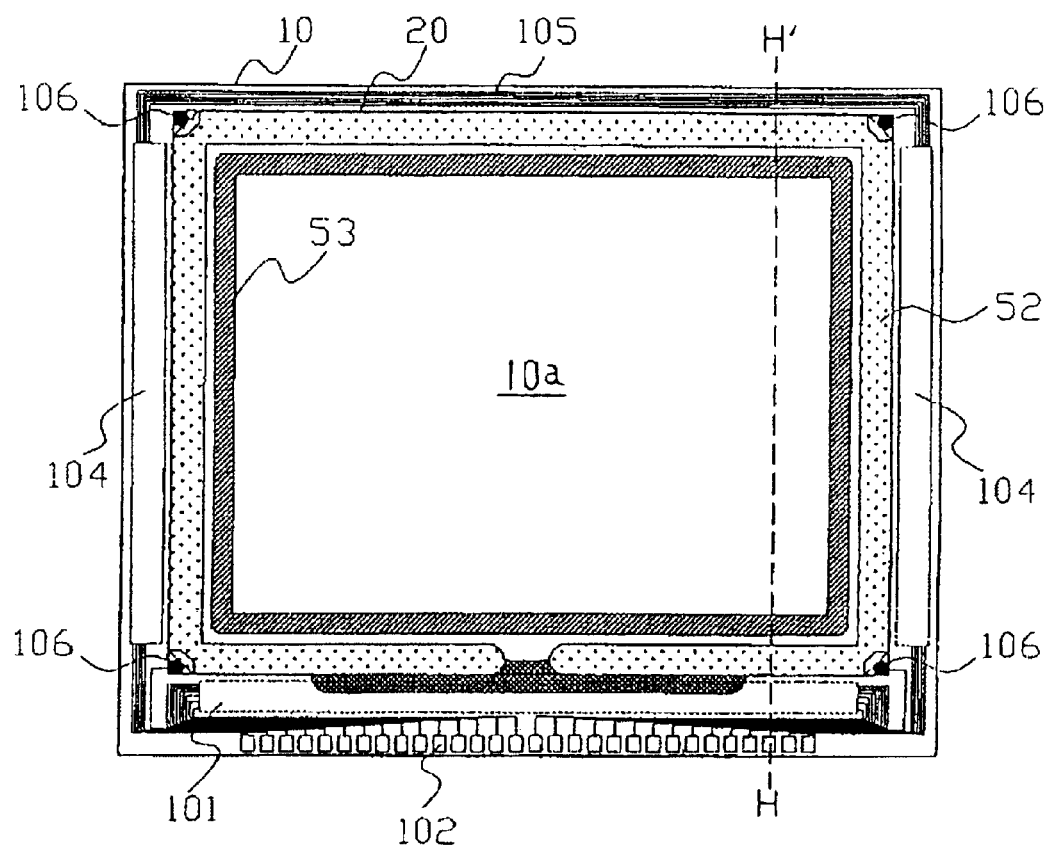
FIG. 10 is a plan view of a TFT array substrate and components formed thereon in an electro-optical device in an exemplary embodiment of the present invention, viewed from the counter substrate side.

The overall structure of the electro-optical device in this exemplary embodiment is described with reference to FIGS. 10 and 11. FIG. 10 is a plan view of a TFT array substrate 10 and components formed thereon, viewed from the counter substrate 20 side, and FIG. 11 is a sectional view taken along plane H–H' of FIG. 10.

Figure 11:
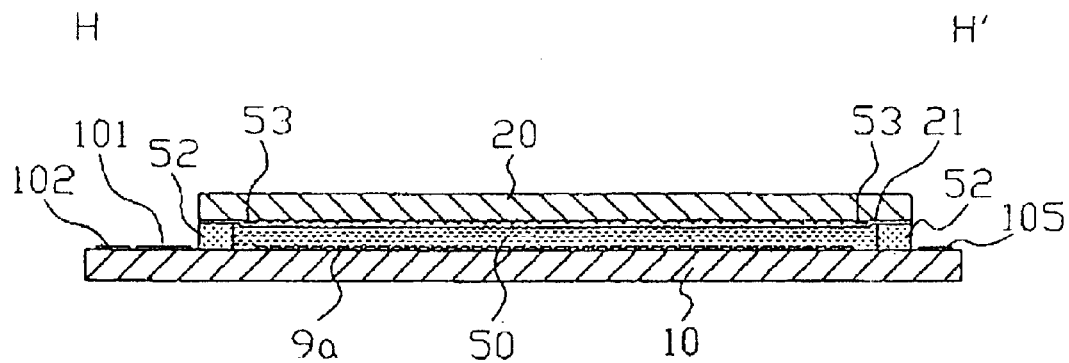
FIG. 11 is a sectional view taken along plane H–H' of FIG. 10.

Referring to FIGS. 10 and 11, in the electro-optical device in this exemplary embodiment, the TFT array substrate 10 and the counter substrate 20 are opposed to each other. A liquid crystal layer 50 is enclosed between the TFT array substrate 10 and the counter substrate 20, and the TFT array substrate 10 and the counter substrate 20 are bonded with each other by a sealant 52 provided in the sealing region located in the periphery of an image display region 10a.

The sealant 52 is composed of, for example, a UV curable resin or a thermosetting resin, and is hardened by UV irradiation, heating, or the like. A gap material (spacer), for example, glass fibers or glass beads, is scattered in the sealant 52 in order to maintain a predetermined gap (inter-substrate gap) between the substrates if the electro-optical device in this embodiment is used for a compact liquid crystal display, such as a projector, which produces a magnified display. Alternatively, if the electro-optical device is used for a large liquid crystal display, such as a liquid crystal display or a liquid crystal television, which produces a display with a magnification factor of 1, such a gap material may be contained in the liquid crystal layer 50.

A data line drive circuit 101, which drives data lines 6a by supplying image signals at a predetermined timing, and external circuit connection terminals 102 are provided along one side of the TFT array substrate 10 outside the sealant 52. Scanning line drive circuits 104, which drive scanning lines 3a by supplying scanning signals at a predetermined timing, are provided along two sides adjacent to the side described above.

If delays in scanning signals supplied to the scanning lines 3a present no problem, the scanning line drive circuit 104 may be placed on only one side. Data line drive circuits 101 may be placed along both sides of the image display region 10a.

A plurality of lines 105 for connecting the scanning line drive circuits 104 provided on both sides of the image display region 10a are formed along the remaining side of the TFT array substrate 10. A conductive member 106 is provided on at least one corner out of four corners of the counter substrate 20 to electrically connect the TFT array substrate 10 and the counter substrate 20 with each other.

In FIG. 11, on the TFT array substrate 10, an alignment layer is formed on pixel electrodes 9a on which TFTs to switch pixels and lines, such as scanning lines and data lines, are provided. On the other hand, on the counter substrate 20, in addition to the counter electrode 21, an alignment layer is formed as the outermost layer. The liquid crystal layer 50 is composed of, for example, one nematic liquid crystal or a mixture of several types of nematic liquid crystals, and is in a predetermined alignment state between the pair of alignment layers.

Additionally, on the TFT array substrate 10, in addition to the data line drive circuit 101, the scanning line drive circuits 104, etc., a sampling circuit which supplies image signals to a plurality of data lines 6a at a predetermined timing, a pre-charge circuit which supplies pre-charging signals at a predetermined voltage level to a plurality of data lines 6a prior to image signals, an inspection circuit to inspect the quality, defects, etc., of the electro-optical device during fabrication and at the time of shipment, and other circuits may be formed.

In each of the exemplary embodiments described above, instead of placing the data line drive circuit 101 and the scanning line drive circuits 104 on the TFT array substrate 10, they may be electrically and mechanically connected, for example, to a driving LSI mounted on a TAB (Tape Automated Bonding) substrate through an anisotropic conductive film provided in the periphery of the TFT array substrate 10. Depending the operation mode, such as a TN (Twisted Nematic) mode, a VA (Vertically Aligned) mode, or a PDLC (Polymer Dispersed Liquid Crystal) mode, and a normally white or normally black mode, polarizing films, retardation films, polarizing plates, etc., are placed in the predetermined directions on the counter substrate 20 at the side to which incident light enters and on the TFT array substrate 10 at the side from which light emits.

The present invention is also applicable to, in addition to liquid crystal devices, other electro-optical devices, such as EL devices using organic EL elements or inorganic EL elements, and electrophoretic devices using thin film transistors, for example.

(Electronic Apparatus)

Figure 12:
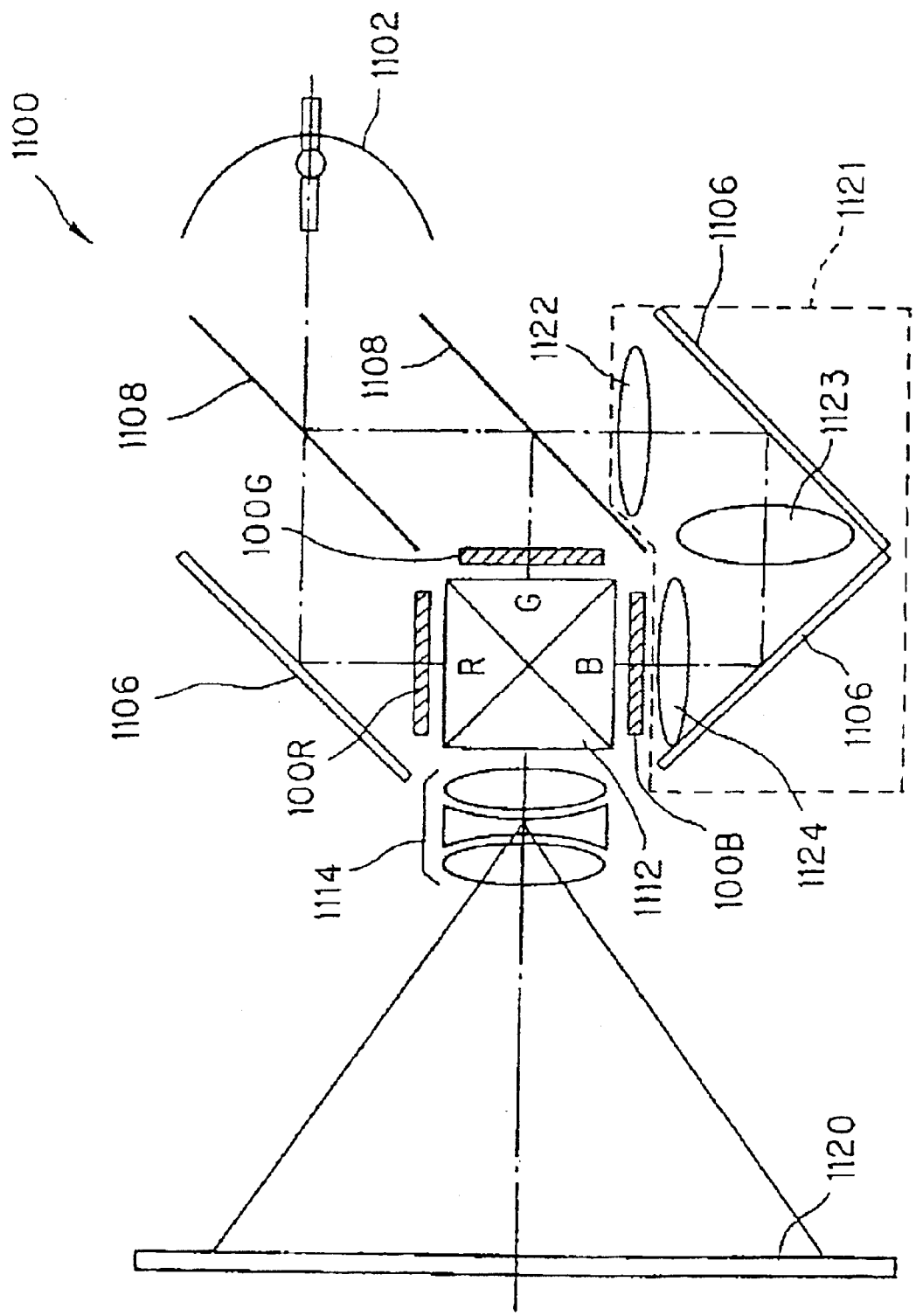
FIG. 12 is a sectional view which schematically shows a color liquid crystal projector as an example of a projection color display device in an exemplary embodiment of an electronic apparatus of the present invention.

Next, with respect to a projection color display device which is an exemplary embodiment of an electronic apparatus in which the electro-optical device described above in detail is used as a light valve, the overall structure and, in particular, the optical structure is described. FIG. 12 is a schematic sectional view of the projection color display device.

Referring to FIG. 12, in a liquid crystal projector 1100 which is an example of the projection color display device in this exemplary embodiment, three liquid crystal modules, each including a liquid crystal device in which drive circuits are mounted on a TFT array substrate, are used as light valves 100R, 100G, and 100B. In the liquid crystal projector 1100, projection light, which is emitted from a lamp unit 1102 including a white light source, such as a metal halide lamp, is separated by three mirrors 1106 and two dichroic mirrors 1108 into three primary color light components R, G, and B. The light components R, G, and B are guided to the light valves 100R, 100G, and 100B corresponding to the individual primary colors, respectively. At this stage, in particular, B light is guided through a relay lens system 1121 composed of an incident side lens 1122, a relay lens 1123, and an emitting side lens 1124 in order to avoid light loss due to its long optical path. The light components corresponding to the three primary colors which are modulated by the light valves 100R, 100G, and 100B, respectively, are combined again by a dichroic prism 1112, and then projected as a color image to a screen 1120 through a projection lens 1114.

The present invention is not limited to the exemplary embodiments described above. It is to be understood that the present invention is intended to embrace all such alternatives, modifications, and variations as may fall within the spirit and scope of the appended claims and the specification. Electro-optical devices and electronic apparatuses in which such modifications are made are also embraced in the technical field of the present invention.

What is claimed is:

1. An electro-optical device, comprising:
   a first substrate;
   scanning lines;
   data lines;
   thin film transistor provided above the first substrate corresponding to intersections of the scanning lines and the data lines;
   pixel electrodes provided corresponding to the thin film transistors the pixel electrodes being arrayed in a matrix, the scanning lines and the data lines being formed in the respective directions which intersect with each other corresponding to the matrix of the pixel electrodes; and
   a nitride film disposed over the surfaces of the data lines extending in the data line direction and over the scanning lines in the direction in which the scanning lines extend.

2. The electro-optical device according to claim 1, the nitride film being disposed following a shape of the data lines in the data line direction and following a shape of the scanning lines in the scanning line direction.

3. An electro-optical device, comprising:
   a first substrate;
   scanning lines;
   data lines;
   thin film transistors provided above the first substrate corresponding to intersections of the scanning lines and the data lines;
   pixel electrodes provided corresponding to the thin film transistors; and
   a nitride film disposed at least on surfaces of the data lines, the nitride film being formed in the periphery of an image display region that is defined by the region including the pixel electrodes, the scanning lines, and the data lines.

4. The electro-optical device according to claim 3, the nitride film extending only on the data lines in addition to in the periphery of the image display region.

5. The electro-optical device according to claim 3, the nitride film extending in a region excluding light transmission regions above the substrate.

6. The electro-optical device according to claim 3, the width of the nitride film which is formed on the data line being larger than the width of the data line.

7. The electro-optical device according to claim 6, the width of the nitride film on the data line being larger than the width of the data line by 0.1 to 0.5 $\mu$m for each edge.

8. The electro-optical device according to claim 3, the thickness of the nitride film being 3 to 100 nm.

9. The electro-optical device according to claim 3, the nitride film being formed by a plasma enhanced CVD process.

10. An electro-optical device, comprising:
a first substrate;
scanning lines;
data lines;
thin film transistors provided above the first substrate corresponding to intersections of the scanning lines and the data lines;
pixel electrodes provided corresponding to the thin film transistors;
a nitride film disposed at least on surfaces of the data lines;
a second substrate which is opposed to the first substrate with an electro-optical material therebetween; and
a light-shielding film disposed above the second substrate at a position corresponding to the scanning lines and the data lines, the width of the nitride film being smaller than the width of the light-shielding film.

11. The electro-optical device according to claim 10, the width of the nitride film being smaller than the width of the light-shielding film by 1 $\mu$m or less at each edge.

12. An electro-optical device, comprising:
a first substrate;
scanning lines;
data lines;
thin film transistors provided above the first substrate corresponding to intersections of the scanning lines and the data lines;
pixel electrodes provided corresponding to the thin film transistors;
a nitride film disposed at least on surfaces of the data lines;
a second substrate which is opposed to the first substrate with an electro-optical material therebetween; and
a light-shielding film disposed above the second substrate at a position corresponding to the scanning lines and the data lines, the width of the nitride film being larger than the width of the light-shielding film.

13. An electronic apparatus, comprising:
an electro-optical device, the electro-optical device including:
a substrate;
scanning lines;
data lines;
thin film transistors provided above the substrate corresponding to intersections of the scanning lines and the data lines;
pixel electrodes provided corresponding to the thin film transistors; and
a nitride film disposed at least on surfaces of the data lines, the nitride film being formed in the periphery of an image display region that is defined by the region including the pixel electrodes, the scanning lines, and the data lines.

* * * * *